(12) United States Patent
Li et al.

(10) Patent No.: US 7,859,891 B2
(45) Date of Patent: Dec. 28, 2010

(54) STATIC SOURCE PLANE IN STRAM

(75) Inventors: Hai Li, Eden Prairie, MN (US); Yiran Chen, Eden Prairie, MN (US); Hongyue Liu, Maple Grove, MN (US); Xuguang Wang, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 105 days.

(21) Appl. No.: 12/242,331

(22) Filed: Sep. 30, 2008

(65) Prior Publication Data

US 2010/0080053 A1 Apr. 1, 2010

(51) Int. Cl.
*G11C 11/00* (2006.01)
(52) U.S. Cl. .................. 365/158; 365/171; 365/173
(58) Field of Classification Search .............. 365/158, 365/171, 173
See application file for complete search history.

(56) References Cited

U.S. PATENT DOCUMENTS

| | | | |
|---|---|---|---|
| 5,343,088 A | 8/1994 | Jeon | |
| 5,532,960 A | 7/1996 | Lin | |
| 5,561,385 A | 10/1996 | Choi | |
| 6,510,079 B2 * | 1/2003 | Viehmann | 365/158 |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 7,596,014 B2 * | 9/2009 | Kawahara et al. | 365/158 |
| 2008/0247222 A1 * | 10/2008 | Jung et al. | 365/158 |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |
| 2010/0054026 A1 * | 3/2010 | Xi et al. | 365/158 |

* cited by examiner

*Primary Examiner*—Pho M Luu
(74) *Attorney, Agent, or Firm*—Campbell Nelson Whipps LLC (57) ABSTRACT

A memory array includes a plurality of magnetic tunnel junction cells arranged in an array. Each magnetic tunnel junction cell is electrically coupled between a bit line and a source line. The magnetic tunnel junction cell is configured to switch between a high resistance state and a low resistance state by passing a write current passing though the magnetic tunnel junction cell. A word line is electrically coupled to a gate of the transistor. The source line is a common source line for the plurality of magnetic tunnel junctions.

6 Claims, 6 Drawing Sheets

STATIC SOURCE PLANE IN STRAM

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market by 2009. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern is that in traditional STRAM design, two metal tracks are required in each column direction, one is for the source line and the other is for the bit line which sets the minimum width of each column. Also, the write current is asymmetric during writing the high and low resistance states in the STRAM cell. The forward current (current flowing from bit line to source line) is larger than the reverse current (current flowing from the source line to the bit line). The driving transistor size is thus determined by the reverse current requirements.

BRIEF SUMMARY

The present disclosure relates to present disclosure relates to a spin-transfer torque memory array having a single source line. In particular the present disclosure relates to a spin-transfer torque memory array having a single static source line that provides a constant voltage when writing the high resistance data state or the low resistance data state to the memory cell. This structure can reduce STRAM cell dimensions, improve array density, and/or balance the driving currents for the high resistance data state or the low resistance data state to the memory cell.

In an illustrative embodiment, a memory array including a plurality of magnetic tunnel junction cells arranged in an array. Each magnetic tunnel junction cell is electrically coupled between a bit line and a source line. The magnetic tunnel junction cell is configured to switch between a high resistance state and a low resistance state by passing a write current passing though the magnetic tunnel junction cell. A transistor is electrically between the magnetic tunnel junction cell and the source line. A word line is electrically coupled to a gate of the transistor. The source line is a common source line for the plurality of magnetic tunnel junction cells.

In another illustrative embodiment, a memory array includes a plurality of magnetic tunnel junction cells arranged in an array. Each magnetic tunnel junction cell is electrically coupled to a transistor. Each magnetic tunnel junction cell is configured to switch between a high resistance state and a low resistance state by passing a write current passing though the magnetic tunnel junction cell. A plurality of bit lines are arranged in columns. Each bit line column is electrically coupled at least selected magnetic tunnel junction cells along the column. A plurality of word lines are arranged in rows that are orthogonal to the word line rows. Each word line row is electrically coupled to at least selected transistors along the row. A source line electrically connects all the transistors in the array.

An illustrative method of writing to a magnetic tunnel junction cell includes applying a static source line voltage to a common source line. The common source line is electrically coupled to a plurality of magnetic tunnel junction cells forming a memory array. A transistor is electrically between each magnetic tunnel junction cell and the common source line. The method then includes passing a write current through a selected magnetic tunnel junction cell in a first direction by grounding a bit line in electrically connection to the selected magnetic tunnel junction cell, to write a first data state to the magnetic tunnel junction cell, or the method includes passing a write current through a selected magnetic tunnel junction cell in a second direction opposing the first direction by applying a write voltage being greater than the static source line voltage to a bit line in electrically connection to the selected magnetic tunnel junction cell, to write a second data state to the magnetic tunnel junction cell.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory array having a single source line. In particular the present disclosure relates to a spin-transfer torque memory array having a single static source line that provides a constant voltage when writing the high resistance data state or the low resistance data state to the memory cell. This structure can reduce STRAM cell dimensions, improve array density, and/or balance the driving currents for the high resistance data state or the low resistance data state to the memory cell. While the present disclosure is not so limited, an appreciation of various aspects of the disclosure will be gained through a discussion of the examples provided below.

Figure 1:
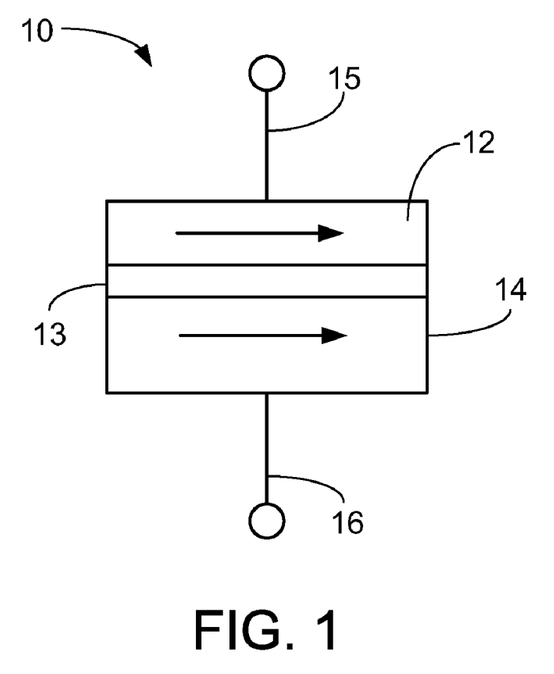
FIG. 1 is a cross-sectional schematic diagram of an illustrative magnetic tunneling junction (MTJ) in the low resistance state.
Figure 2:
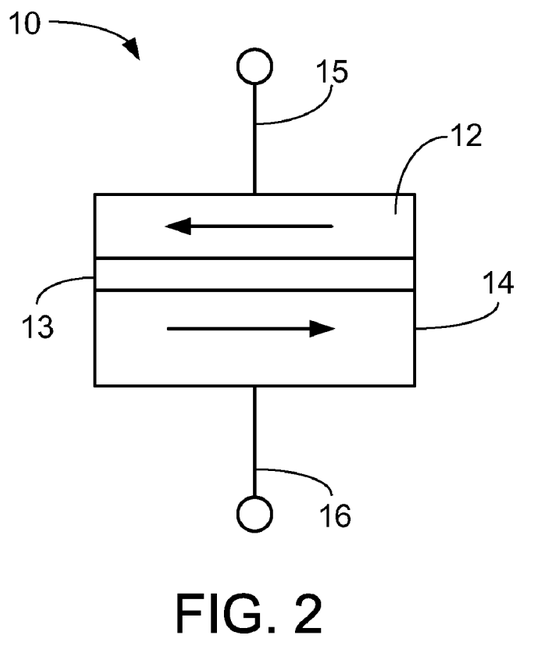
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any useful memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
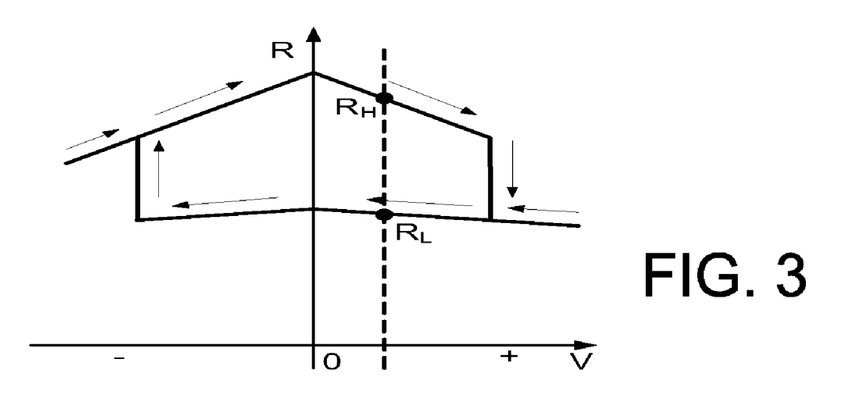
FIG. 3 is a graph of a static R-V sweep curve of a MTJ.

FIG. 3 is a graph of a static R-V sweep curve of a MTJ cell. When applying a positive voltage on the second electrode 16 in FIG. 1 or 2, the MTJ cell 10 enters the positive applied voltage region in FIG. 3 and switches from the high resistance state (FIG. 2) to the low resistance state (FIG. 1). When applying a positive voltage on the first electrode 15 in FIG. 1 or 2, the MTJ cell 10 enters the negative applied voltage region in FIG. 3. The resistance of the MTJ cell switches from the low resistance state (FIG. 1) to the high resistance state (FIG. 2).

Let $R_H$ and $R_L$ denote the high and low magnet resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the MTJ cell.

Figure 4:
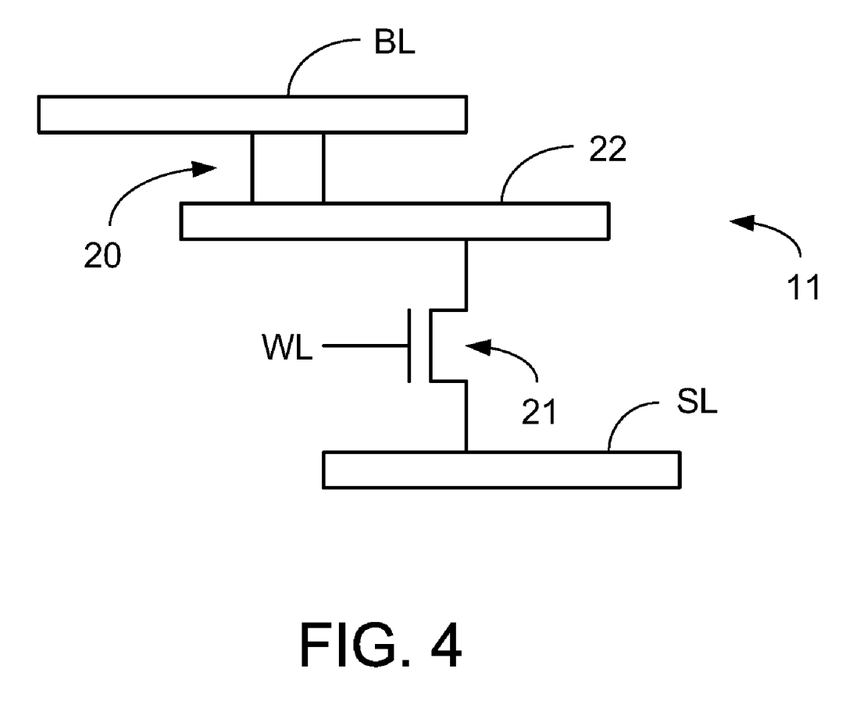
FIG. 4 is side view schematic diagram of a memory unit.

FIG. 4 is schematic circuit diagrams of a memory apparatus 11. The memory apparatus 11 includes magnetic tunneling junction (MTJ) cell 20 electrically between a bit line BL and a source line SL. The magnetic tunneling junction (MTJ) cell 20 is configured to switch between a high resistance state and a low resistance state, as described above. The transistor 21 is electrically between the source line SL and the MTJ cell 20. The transistor 21 is electrically coupled to a word line WL via a gate contact of the transistor 21. The transistor 21 can be any useful transistor such as, for example, a NMOS or PMOS semiconductor device. In many embodiments, the transistor 21 can be electrically coupled to the MTJ cell 20 in any useful internal electrical connection such as with an electrode 22.

Figure 5:
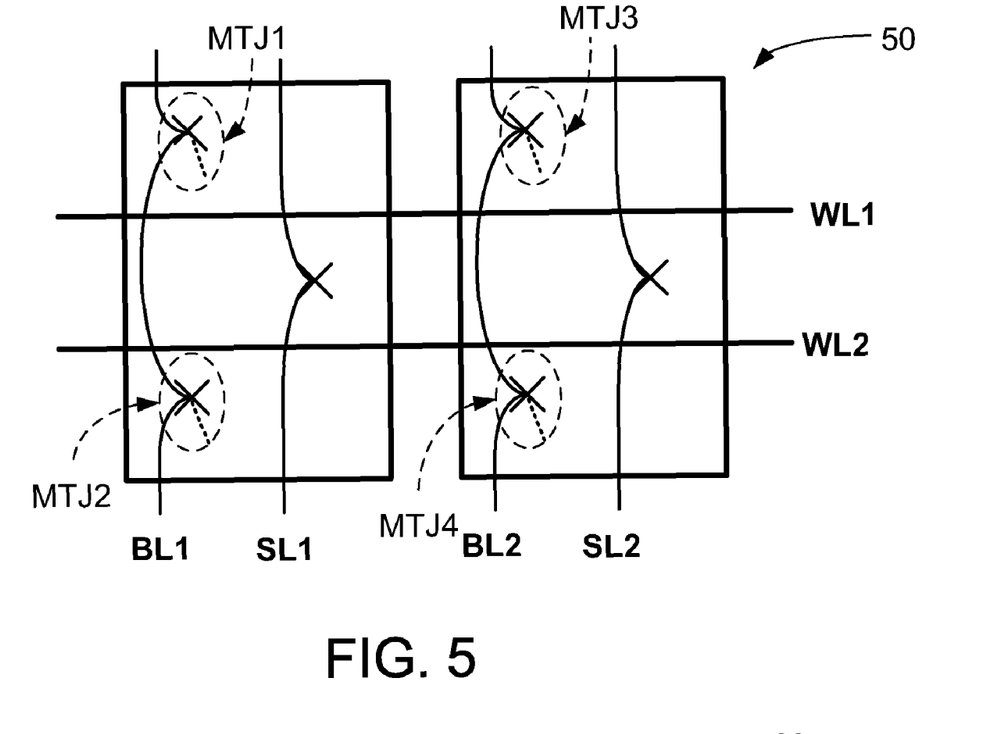
FIG. 5 is a top view schematic diagram of a traditional memory array.

FIG. 5 is a top view schematic diagram of a traditional memory array 50. A side view of in individual MTJ cell apparatus is shown in FIG. 4. The memory array 50 includes four MTJ cells MTJ1, MTJ2, MTJ3, MTJ4 arranged in a 2×2 array. The memory array 50 includes two word lines WL1, WL2, two bit lines BL1, BL2, and two source lines SL1, SL2 to operate the 2×2 memory array 50. It is understood that while a 2×2 array is illustrated, the memory array 50 can includes any number of MTJ cells arranged in an array. As illustrated, each column (or row) of the memory array 50 requires a separate source line SL1 and SL2 to operate the 2×2 memory array 50. The BL1 and SL1 operate MTJ1 and MTJ2 depending on whether WL1 or WL2 is activated. The BL2 and SL2 operate MTJ 3 and MTJ4 depending on whether WL1 or WL2 is activated.

Figure 6:
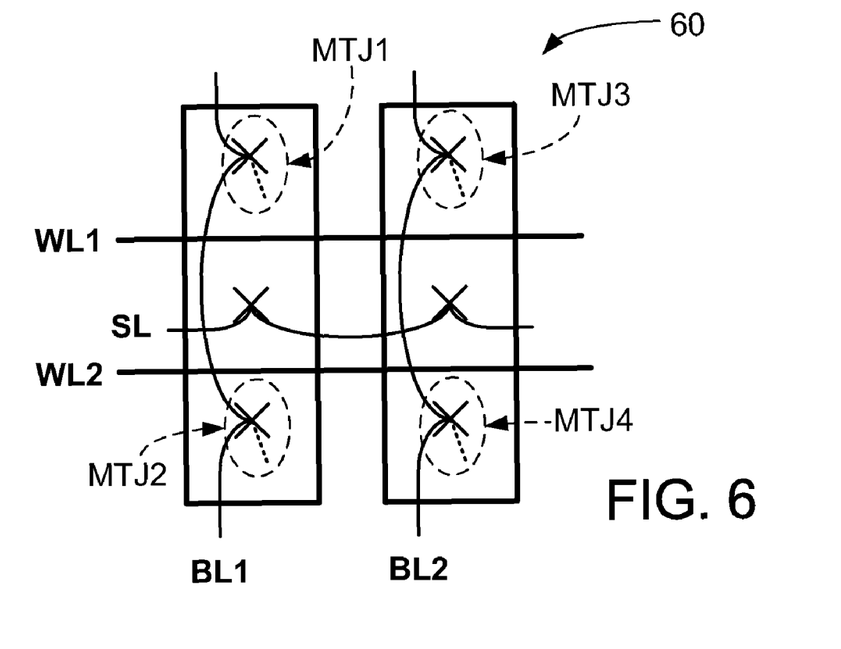
FIG. 6 is a top view schematic diagram of an illustrative memory array.

FIG. 6 is a top view schematic diagram of an illustrative memory array 60. A side view of in individual MTJ cell apparatus is shown in FIG. 4. The memory array 60 includes four MTJ cells MTJ1, MTJ2, MTJ3, MTJ4 arranged in a 2×2 array. The memory array 56 includes two word lines WL1, WL2, two bit lines BL1, BL2, and a common source lines SL to operate the 2×2 memory array 60. It is understood that while a 2×2 array is illustrated, the memory array 60 can includes any number of MTJ cells arranged in an array. As illustrated, the memory array 60 requires a single common source line SL to operate the 2×2 (or any size) memory array 60. This configuration can reduce the size of a memory array by at least 10% or at least 20% or at least 30%, as shown in Table 1 below, as compared to the configuration illustrated in FIG. 5 as compared to the traditional layout constriction. If considering the driving ability of the two write currents, this configuration can balance the write currents (for writing the high and low resistance states) to be within 30% of each other, or within 20% of each other, or within 10% of each other, as shown in Table 1 below. In many embodiments, both the size reduction and balancing the driving ability of the two write currents are taken into consideration.

The BL1 and SL operate MTJ1 and MTJ2 depending on whether WL1 or WL2 is activated. The BL2 and SL operate MTJ 3 and MTJ4 depending on whether WL1 or WL2 is activated. In many embodiments, the word lines WL1, WL2 are orthogonal to the bit lines BL1, BL2.

While the source line is illustrated as a line, it is understood that the source line can be a described as a source plane where the source plane electrically connects all the transistors in the array at the same time. Activation of the particular word line allows current to flow through the particular MTJ cell for writing to the MTJ cell, as described above.

When writing to each MTJ cell a fixed static voltage (VDD/2) is provided so there is no charging/discharging on it. During writing "1" operation, the BL voltage is set to GND so that driving current flow from SL to BL. During writing "0" operation, the BL is connected to VDD and hence, driving current should flow from BL to SL. The reading scheme of this design could be as same as conventional STRAM—a small read current flow is provided to flow from BL to SL.

Figure 7A:
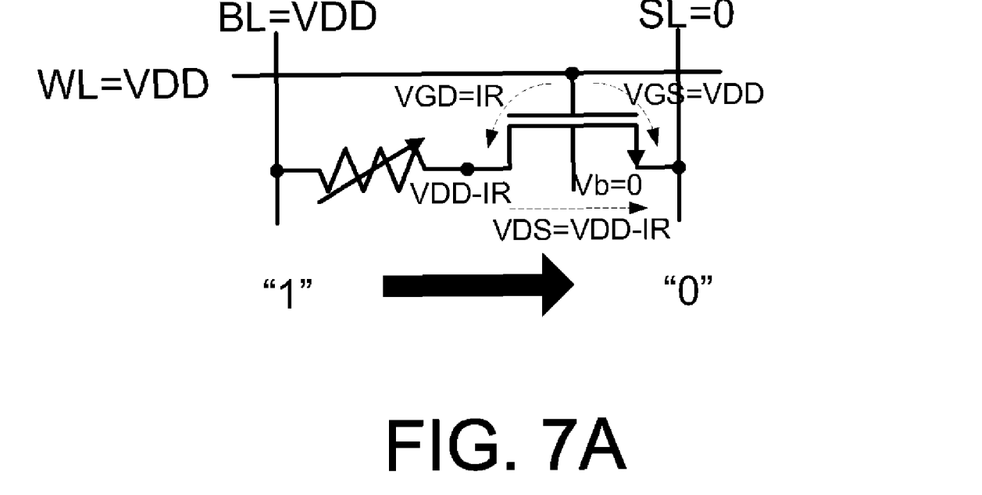
FIG. 7A is schematic circuit diagram of a traditional STRAM in writing "0" mode.
Figure 7B:
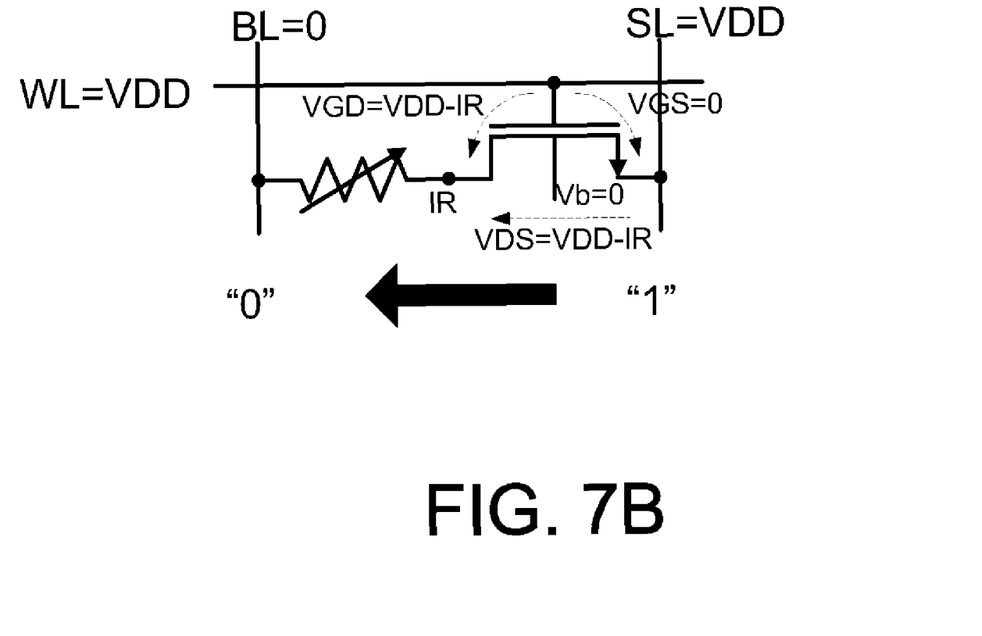
FIG. 7B is schematic circuit diagram of a traditional STRAM in writing "1" mode.

FIG. 7A is schematic circuit diagram of a traditional STRAM in writing "0" mode. FIG. 7B is schematic circuit diagram of a traditional STRAM in writing "1" mode. When writing the "0" mode, the traditional source line SL is set to ground and the bit line BL is set to the write voltage VDD. The write voltage VDD can be provided by a first voltage generator (not show). The first voltage generator can be provided on-chip. The word line WL is set to an activation voltage VDD to allow current to flow through the transistor. When writing the "1" mode, the traditional source line SL is set to the write voltage VDD and the bit line BL is set to ground. The word line WL is set to an activation voltage VDD to allow current to flow through the transistor.

Figure 8A:
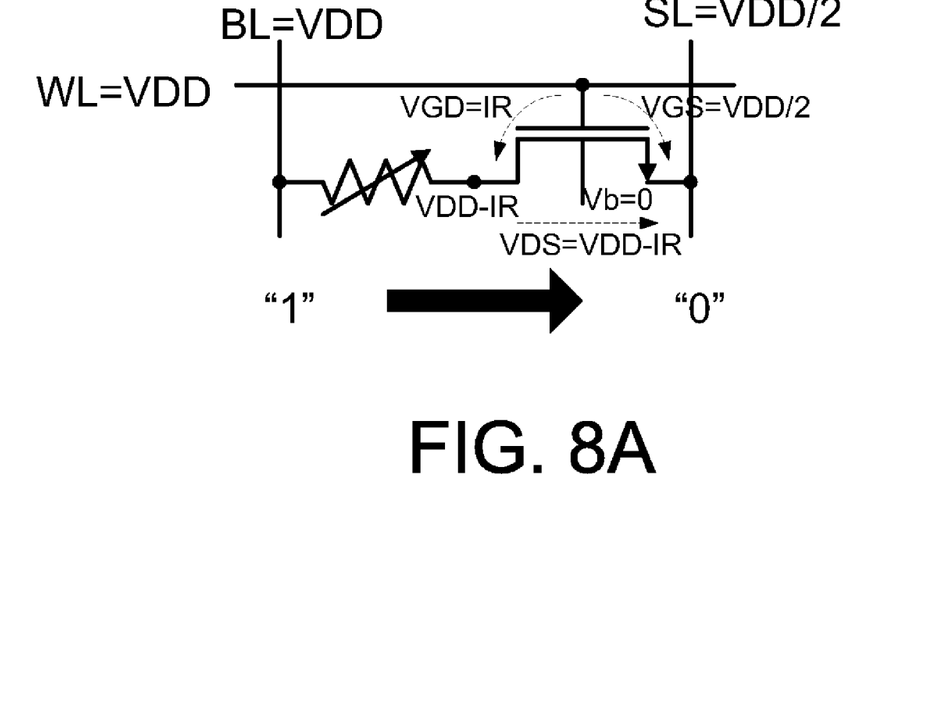
FIG. 8A is schematic circuit diagram of an illustrative STRAM in writing "0" mode.
Figure 8B:
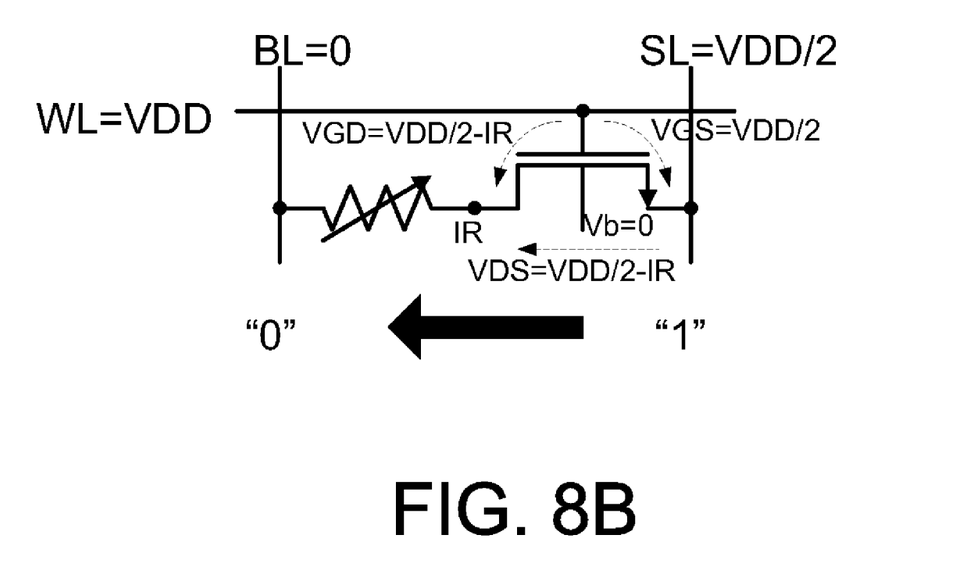
FIG. 8B is schematic circuit diagram of an illustrative STRAM in writing "1" mode.

FIG. 8A is schematic circuit diagram of an illustrative STRAM in writing "0" mode. FIG. 8B is schematic circuit diagram of an illustrative STRAM in writing "1" mode'. When writing the "0" mode, the source line SL is set to a voltage value between the write voltage and ground and is denoted as VDD/2 and the bit line BL is set to the write voltage VDD. The write voltage VDD can be provided by a first voltage generator (not show) and the source line static voltage can be provided by a second voltage generator (not shown). The first voltage generator and the second voltage generator can be provided on-chip. The word line WL is set to an activation voltage VDD to allow current to flow through the transistor. When writing the "1" mode, the source line SL remains set to a voltage value between the write voltage and ground and is denoted as VDD/2 and the bit line BL is set to ground. The word line WL is set to an activation voltage VDD to allow current to flow through the transistor. Thus, in both writing operations, the source line is set to a static voltage level that can be, in many embodiments, equal to VDD/2.

Table 1 compares the simulated writing current of conventional STRAM design and our Static Source design described herein. All the simulations were done at TSMC 130 nm technology node. In this table, the active current measures the current flowing through bit cell when bit cell is selected (WL=1). The active current is normalized to the minimal required writing current.

TABLE 1

Writing Current Comparison of Conventional and Propose Bit Cells

| Write Current | | Conventional Tx size = 1 | Static Source Plane Tx size = 1 | Static Source Plane Tx size = 0.75 |
|---|---|---|---|---|
| Active | Forward | 1.45 | 1.28 | 1 |
| | Reverse | 1 | 1.32 | 1.13 |
| Leakage | Forward | 1 | 0.0001 | 0.0001 |
| | Reverse | 1 | 0.60 | 0.55 |

The simulation result shows that the forward current is 45% more than reverse current, which is the minimal required writing current, in a conventional STRAM bit cell. However, if using the same driving transistor size in our new design, forward and reverse currents are more balanced: both of them are around 30% more than the minimal required writing current. In other words, the driving transistor in the new design can be reduced to 75% of conventional design, while we can achieve the same driving ability.

The technique can be further improved by dynamically changing a body bias of the driving transistor: When a row is selected, we can dynamically increase its body bias in order to get higher driving current. Table 2 shows the simulation results if we apply dynamic body biasing on the proposed STRAM cells. The required transistor size can be further reduced to 65% of conventional design and it can still achieve the minimal driving ability required.

TABLE 2

Writing Current Comparison of Conventional Bit Cell and Proposed w/ Dynamic Body Biasing

| | | Conventional Tx size = 1 | Proposed w/ dynamic body biasing Tx size = 1 | Proposed w/ dynamic body biasing Tx size = 0.65 |
|---|---|---|---|---|
| Active | Forward | 1.45 | 1.45 | 1 |
| | Reverse | 1 | 1.40 | 1.08 |
| Leakage | Forward | 1 | 0.0001 | 0.0001 |
| | Reverse | 1 | 0.60 | 0.51 |

The tables above illustrate that the disclosed static source plane memory cell architecture improves the driving symmetry of the STRAM memory cell and can also reduce the physical footprint of the STRAM memory cell, allowing for an increase in memory density. The proposed STRAM memory array structure having a single source plane for the array balances the forward and reverse driving ability of the STRAM memory cell and can also reduce the driving transistor size, leading to additional scaling of the memory array.

Figure 9:
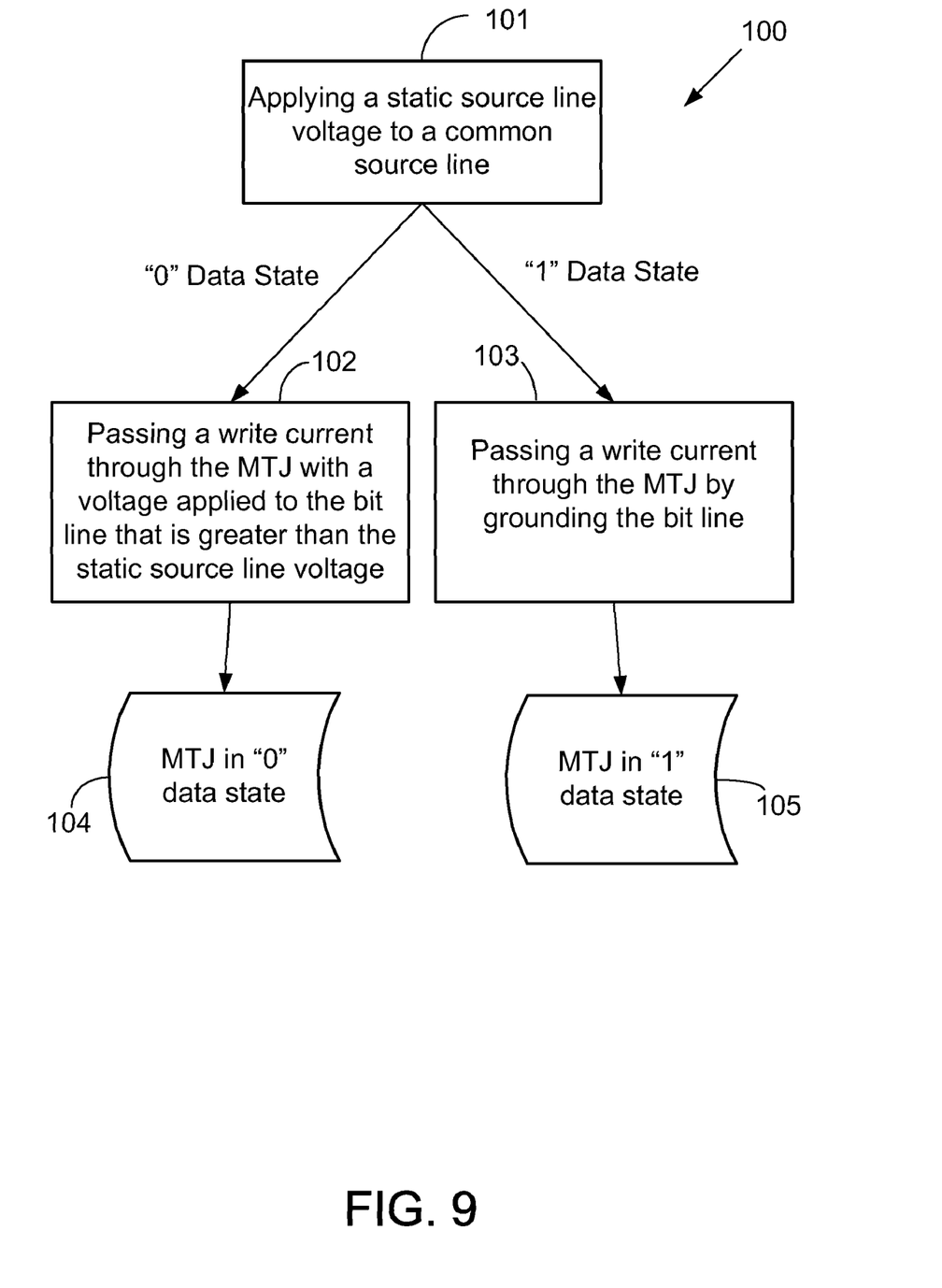
FIG. 9 is a flow diagram of an illustrative method of writing to a memory array.

FIG. 9 is a flow diagram of an illustrative method of writing to a memory array 100. The method includes applying a static source line voltage to a common source line at block 101. The common source line is electrically coupled to a plurality of magnetic tunnel junction cells forming a memory array. A transistor is electrically between each magnetic tunnel junction cell and the common source line. If writing the "0" data state to the STRAM cell at block 102, a write current is passed through a selected magnetic tunnel junction cell in a first direction by applying a write voltage being greater than the static source line voltage to a bit line in electrically connection to the selected magnetic tunnel junction cell. The MTJ is then in the "0" data state at block 104. If writing the "1" data state to the STRAM cell at block 103, a write current is passed through a selected magnetic tunnel junction cell in a second direction opposing the first direction by grounding the bit line in electrically connection to the selected magnetic tunnel junction cell. The MTJ is then in the "1" data state at block 105.

Thus, embodiments of the STATIC SOURCE PLANE IN STRAM are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method or writing to a magnetic tunnel junction cell, comprising:
    applying a static source line voltage to a common source line, the common source line electrically coupled to a plurality of magnetic tunnel junction cells forming a memory array, a transistor electrically between each magnetic tunnel junction cell and the common source line; and
    passing a write current through a selected magnetic tunnel junction cell in a first direction by grounding a bit line in electrically connection to the selected magnetic tunnel junction cell, to write a first data state to the magnetic tunnel junction cell; or
    passing a write current through a selected magnetic tunnel junction cell in a second direction opposing the first direction by applying a write voltage being greater than the static source line voltage to a bit line in electrically connection to the selected magnetic tunnel junction cell, to write a second data state to the magnetic tunnel junction cell.

2. A method according to claim 1, further comprising body biasing the transistor during the passing a write current through a selected magnetic tunnel junction cell in a first direction or in a second direction.

3. A method according to claim 1, wherein the passing a write current in a first direction and passing a write current in a second direction provides write currents that are within 20% of each other.

4. A method according to claim 1, wherein the passing a write current in a first direction and passing a write current in a second direction writes to the magnetic tunnel junction cell via spin-transfer torque.

5. A method according to claim 1, wherein the applying step comprises applying a static source line voltage to a common source line providing the static source line voltage to substantially all the transistors in the array at substantially the same time.

6. A method according to claim 1, wherein the static source line voltage is provided by a first voltage generator and the write voltage is provided by a second voltage generator.

\* \* \* \* \*